United States Patent [19]

Maejima

[11] Patent Number: 6,041,002
[45] Date of Patent: Mar. 21, 2000

[54] SEMICONDUCTOR MEMORY DEVICE AND METHOD OF TESTING THE SAME

[75] Inventor: Hiroshi Maejima, Tokyo, Japan

[73] Assignee: Kabushiki Kaisha Toshiba, Kawasaki, Japan

[21] Appl. No.: 09/196,192

[22] Filed: Nov. 20, 1998

[30] Foreign Application Priority Data

Nov. 21, 1997 [JP] Japan .................................. 9-321199

[51] Int. Cl.$^7$ ........................................... G11C 7/00
[52] U.S. Cl. ................................... 365/201; 365/200
[58] Field of Search .................... 365/201, 200, 365/230.03; 371/21.1

[56] References Cited

U.S. PATENT DOCUMENTS

| | | | |
|---|---|---|---|
| 5,629,943 | 5/1997 | McClure | 365/201 |
| 5,666,317 | 9/1997 | Tanida et al. | 365/201 |
| 5,796,671 | 8/1998 | Wahlstrom | 365/230.03 |

OTHER PUBLICATIONS

Toshiaki Kirihata et al.; "Flexible Test Mode Approach for 256–Mb DRAM"; IEEE Journal of Solidstate Circuits, Oct. 1997, vol. 32 No. 10, pp. 1525–1533.

*Primary Examiner*—David Nelms
*Assistant Examiner*—Anh Phung
*Attorney, Agent, or Firm*—Banner & Witcoff, Ltd.

[57] ABSTRACT

In a method of testing a leakage of a charge of DRAM memory cells, in test mode, test mode signal TM-BLLTC from test mode signal generating circuit is supplied to a partial row decoder and a column decoder, so that a selection of all the word lines is prohibited and all the columns of a memory cell array are selected. In this state, a write cycle is executed and data is supplied to each bit line from a data input and output line. Based on the data from the data input and output line, the voltages of the bit lines can be controlled directly, and a charge leakage test of the DRAM memory cells can be carried out accurately, without using data read from the memory cells.

10 Claims, 11 Drawing Sheets

SEMICONDUCTOR MEMORY DEVICE AND METHOD OF TESTING THE SAME

BACKGROUND OF THE INVENTION

The present invention relates to a semiconductor memory device such as a DRAM and a method of testing the same, and relates, more particularly, to a semiconductor memory device incorporating a circuit for testing a presence or absence of a leakage of charges held in memory cells and a method of testing the same.

There have been carried out various types of tests to semiconductor memory devices including DRAM's or others in order to detect defective products prior to their shipments. These tests are called a die sorting test or the like, which generally include a contact checking, a current value checking of a stand-by current, an operation current, etc., a testing of a DC system including an internal voltage monitor, etc., a function testing for screening defective bits in a memory cell array by variously changing an applied voltage, timing of a voltage application and a writing pattern to the cell array, etc.

This function test includes a leakage test (hereinafter to be referred to as "Cell transfer-gate leak acceleration test") for checking a presence or absence of a leakage of charges held in memory cells. According to this "Cell transfer-gate leak acceleration test", a stress is applied to between a capacitor and a bit line of memory cells thereby to test a presence or absence of a leakage of charges via select transistors of cells. Along with the progress of low voltage, a threshold voltage VTH of a select transistor of each of cells also becomes low. This results in an increase in sub-threshold current. Therefore, it is considered there will be an increasing need of a test for checking a leakage of charges via transistors of cells.

A method of the conventional "Cell transfer-gate leak acceleration test" will be explained below with reference to FIG. 8.

FIG. 8 shows a normal DRAM memory array and its peripheral circuits. Each column has a pair of bit lines BL and /BL, and a memory cell connected to the bit line /BL side and a memory cell connected to the bit line /BL side are connected to different word lines WL. This cell arrangement has been used conventionally for the purpose of increasing the density of high integration and has also been well known.

For carrying out the "Cell transfer-gate leak acceleration test" to the cell array of FIG. 8, at first, data "1" is written into all memory cells M11 to M49, and then any one optional word line connected to the memory cell of the bit line BL side, for example WL1, is started, and data is read out from the memory cells (reference cells in the drawing) M15, M25, M35 and M45 connected to the word line WL1 onto corresponding bit lines BL1, BL2, BL3 and BL4. Thus, the voltage of each of the bit lines BL1, BL2, BL3 and BL4 becomes higher than a pre-charge voltage (VCC/2) and also becomes higher than each voltage of bit lines /BL1, /BL2, /BL3 and /BL4 that hold the pre-charge voltage. This voltage difference is sensed and amplified by a corresponding sense amplifier (S/A), and the voltages of the bit lines BL1, BL2, BL3 and BL4 are set to VCC and the voltages of the bit lines /BL1, /BL2, /BL3 and /BL4 are set to 0 V. With this arrangement, the voltage VCC is applied to between the drain and the source of the select transistor of each memory cell connected to the bit lines /BL1, /BL2, /BL3 and /BL4 side. Thus, a stress is applied to between the source and the drain of the select transistor of each of the memory cells.

In actual practice, this reading operation is executed repeatedly at a predetermined time interval. More specifically, a RAS Only Refresh cycle for selecting the same word line WL1 is executed repeatedly by 2,560 times in a RAS cycle time (tRC=200 µs), for example. As a result, the word line WL1 is selected during a period of 512 ms (=2,560×200 µs), and the stress is kept being applied to each memory cell connected to the bit lines /BL1, /BL2, /BL3 and /BL4 side during this period.

FIG. 9 is a cross-sectional structure of a memory cell for explaining a state that a stress is applied to a memory cell. A reference is made to a memory cell M16 structured by a select transistor Q16 and a trench capacitor C16. The source of the select transistor Q16 is connected to the bit line /BL1 that is set to 0 V, and the drain is connected to the trench capacitor C16 held at VCC by the writing of the data "1". Accordingly, the voltage VCC is applied to between the drain and the source of the select transistor Q16 during a 512 ms period. If there is a defect that the sub-threshold current of the transistor Q16 is large, a charge leaks out from the trench capacitor C16.

After the 2,560 times of RAS Only Refresh cycle for selecting the word line WL1 have been completed, a RAS Only Refresh for starting an optional one word line connected to the memory cell of the bit line /BL side, for example, WL2, is executed repeatedly by 2,560 times at a time interval of RAS cycle time (tRC=200 µs). In this RAS Only Refresh cycle, data is read out from the memory cells (reference cells in the drawing) M16, M26, M36 and M46 connected to the word line WL2 onto corresponding bit lines /BL1, /BL2, /BL3 and /BL4 as shown in FIG. 10. Thus, the voltage of each of the bit lines /BL1, /BL2, /BL3 and /BL4 becomes higher than a pre-charge voltage (VCC/2) and also becomes higher than the voltage of each of the bit lines BL1, BL2, BL3 and BL4 that hold the pre-charge voltage. This voltage difference is sensed and amplified by a corresponding sense amplifier (S/A), and the voltages of the bit lines /BL1, /BL2, /BL3 and /BL4 are set to VCC and the voltages of the bit lines BL1, BL2, BL3 and BL4 are set to 0 V. With this arrangement, the voltage VCC is applied to between the drain and the source of the select transistor of each memory cell connected to the bit lines BL1, BL2, BL3 and BL4 side. Thus, a stress is applied to the memory cells.

Last, a data reading operation is carried out for checking a presence or absence of a leakage. In other words, data of all the memory cells are read out by the normal data reading operation, and it is checked whether the value of data read out from each memory cell coincides with an expected value "1" or not. There is no leakage of charge in the memory cell if the value of the read-out data coincides with the expected value "1", and there is a leakage of charge in the memory cell if the value of the read-out data coincides with "0".

However, since this conventional "Cell transfer-gate leak acceleration test" employs a system of controlling a bit line voltage by latching the data read out from the memory cell that becomes a reference cell by the sense amplifier S/A, it is not possible to apply a desired voltage to between the capacitor and the bit line of the cell if the bit line voltage has a value opposite to an expected value because of a poor fixing of the memory cell itself (for example, a defect that the data "0" is held in the memory cell, and the data "1" cannot be written into the memory cell) or due to a line failure that a selected word line itself is not started. Therefore, there arises such an inconvenience that it is not possible to detect accurately a presence or absence of a leakage failure.

Further, when, after a fuse blow, the "Cell transfer-gate leak acceleration test" is applied to a DRAM in which a main array block and a spare word line block are mutually independent and sense amplifiers are provided separately and only one of the blocks is operated in the normal operation, there is the following problem.

There may be a case where one of the two word lines selected by the "Cell transfer-gate leak acceleration test" as described above has been replaced by the spare word line due to the fuse blow. In this case, if the main array block and the spare array block are mutually independent and the sense amplifiers are provided separately, there is no change in the voltage of the bit line within the main array even if the RAS Only Refresh cycle is executed by starting the spare word line. Accordingly, even if the cells within the spare block can be tested, a stress cannot be applied to the cells within the main array. As a result, an accurate leakage test cannot be carried out.

BRIEF SUMMARY OF THE INVENTION

The present invention has been made in the light of the above situation, and it is an object of the present invention to provide a semiconductor memory device that can carry out accurately a charge leakage test of memory cells by directly controlling the bit line voltage without utilizing data read out from the memory cells and a method of testing the semiconductor memory device.

In order to solve the above-described problems, a semiconductor memory device of the present invention comprises a memory cell array structured by a plurality of memory cells disposed in a row and column matrix shape, each memory cell being connected to a bit line and a word line; a row decoder for selecting one word line from the plurality of word lines based on an address signal from outside; a non-selective state setting circuit for setting all of the plurality of word lines to a non-selective state according to test mode signal; a column decoder for selecting a column from which data is to be read and into which data is to be written, from a plurality of columns within the memory cell array based on the address signal from outside; a data input and output line used for data input and output between the memory cell array and an external terminal and for being connected to a bit line of a selected column; a selective-state setting circuit for setting all of the plurality of columns within the memory cell array to a selective-state according to the test mode signal; and test mode signal generating circuit for generating the test mode signal in test mode for testing a leakage of a charge held in a memory cell. According to the semiconductor memory device, all the columns are selected regardless of an address from the outside, and a selection of all the word lines is prohibited in the test mode. By executing the write cycle in this state, each bit line voltage can be controlled directly based on the data from the data input and output line. Accordingly, all the bit lines can be set to a desired voltage regardless of a presence or absence of a data fixing failure of a memory cell or even in a test after a fuse blow. As a result, it becomes possible to apply sufficient stress to between the capacitor and bit line of each memory cell. Also, in the semiconductor memory device, the test mode signal generating circuit may decode the address signal input from outside in a CAS before RAS cycle and may generate the test mode signal when the input address signal assigns the test mode. Furthermore, in the semiconductor memory device, the row decoder may comprise a first row decoder circuit for decoding a high-order bit of a row address of the address signal input from outside and for generating a signal for selectively driving a plurality of word line drive signal lines according to a result of the decoding; and a second row decoding circuit for decoding a low-order bit of the row address of the address signal input from outside and for selecting one of the plurality of word lines based on a result of the decoding and a driving state of the plurality of word line drive signal lines, wherein the non-selective state setting circuit for setting the plurality of word lines to all non-selective state includes a circuit for prohibiting the driving of the word line drive signal lines by the first row decoder circuit according to the test mode signal. Moreover, in the semiconductor memory device, the test mode signal generating circuit may include a WCBR cycle detector and an address decoder; the WCBR cycle detector receives a /RAS signal, a /CAS signal, and a /WE signal, and generates an enabling signal for enabling the address decoder, when the WCBR cycle detector detects a WCBR cycle; and the address decoder receives and decodes an address input signal, and outputs a decoded signal as the test mode signal in accordance with the enabling signal from the WCBR cycle detector when a test mode assigned by the address input signal is a charge leakage test mode. Still further, in the semiconductor memory device, the test mode signal generating circuit may further include a latch circuit for latching the test mode signal output from the address decoder.

Further, according to the present invention, it is also possible to provide a switching circuit between a predetermined power source voltage supply terminal such as a power supply or a ground and each bit line and to control the bit line voltage by turning on the switching circuit in the test mode, instead of writing data to the bit line from the data input and output line. Another semiconductor device of the present invention comprises a memory cell array structured by a plurality of memory cells disposed in a row and column matrix shape, each memory cell being connected to a bit line and a word line; a row decoder for selecting one word line from the plurality of word lines based on an address signal input from outside; a column decoder for selecting a column from which data is to be read and into which data is to be written, from a plurality of columns within the memory cell array, based on the address signal input from outside; a data input and output line used for data input and output between the memory cell array and an external terminal and for being connected to a bit line of a selected column; a switching circuit provided between a bit line of each of the plurality of columns and a power supply terminal for supplying a power source voltage; and a voltage setting circuit for setting the power source voltage on each bit line by turning on the switching circuit in test mode for testing a leakage of a charge held in a memory cell.

A method of testing a semiconductor memory device of the present invention comprises a memory cell array structured by a plurality of memory cells disposed in a row and column matrix shape, each memory cell being connected to a bit line and a word line, a row decoder for selecting one word line from the plurality of word lines based on an address signal from outside, a column decoder for selecting a column from which data is to be read and into which data is to be written, from a plurality of columns within the memory cell array based on the address signal from outside, and a data input and output line used for data input and output between the memory cell array and an external terminal and for being connected to a bit line of a selected column, wherein, in test mode for testing a leakage of a charge held in a memory cell of the semiconductor memory device, a data writing cycle is executed in a state that all of the plurality of word lines are set to a non-selective state and all of the plurality of columns are set to a selective state, and the voltages of bit lines of all of the columns are controlled based on data from the data input and output line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained below with reference to the drawings.
(First embodiment)

Figure 1:
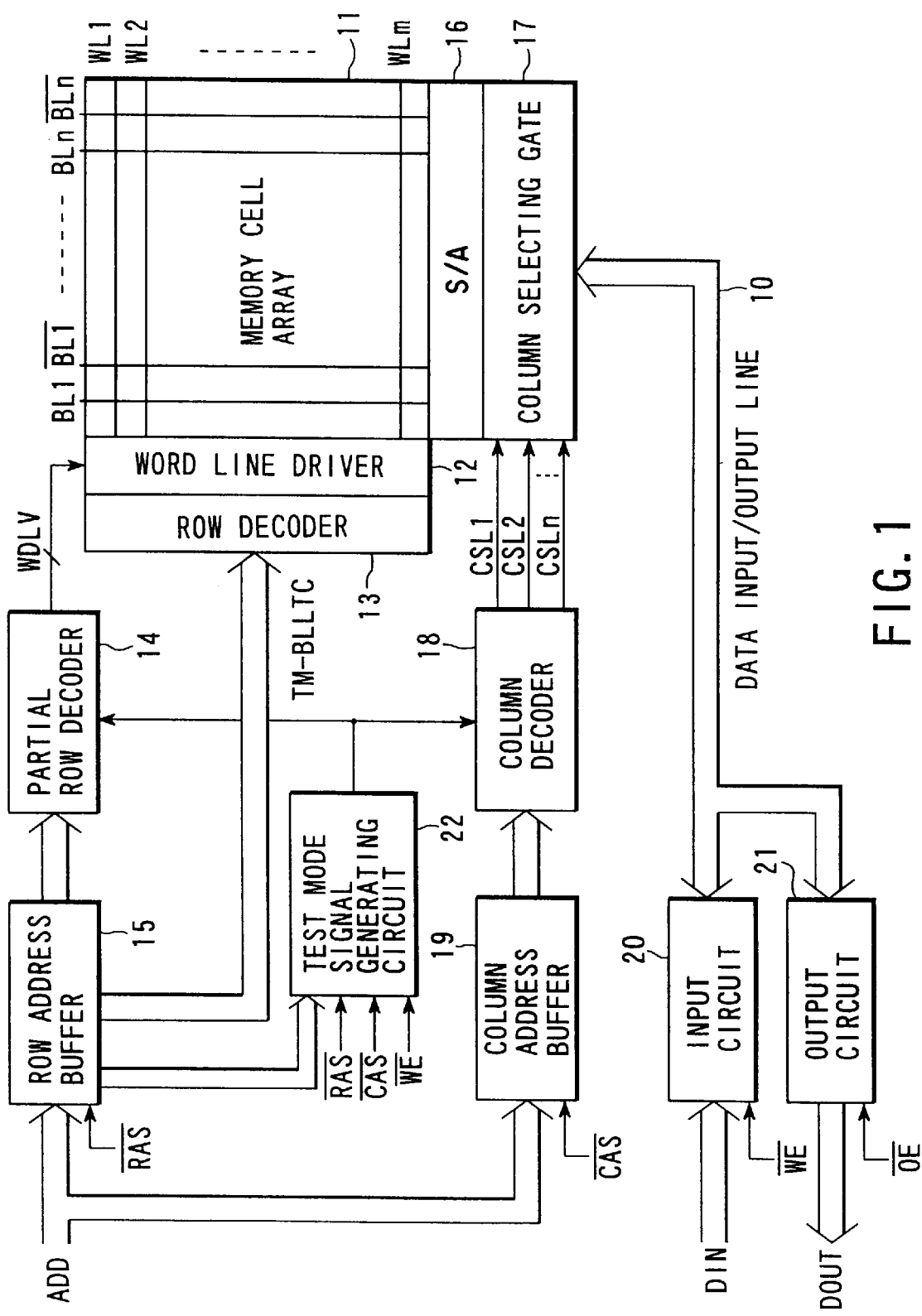
FIG. 1 is a block diagram for showing an overall structure of a DRAM relating to a first embodiment of the present invention.

FIG. 1 shows an overall structure of a DRAM as a semiconductor memory device relating to a first embodiment of the present invention. On a chip of this DRAM, there are provided a memory cell array 11, a word line driver 12, a row decoder 13, a partial row decoder 14, a row address buffer 15, a sense amplifier (S/A) 16r a column selective gate 17, a column decoder 18, a column address buffer 19, a data input circuit 20, a data output circuit 21 and test mode signal generating circuit 22, as shown in this drawing.

Figure 9:
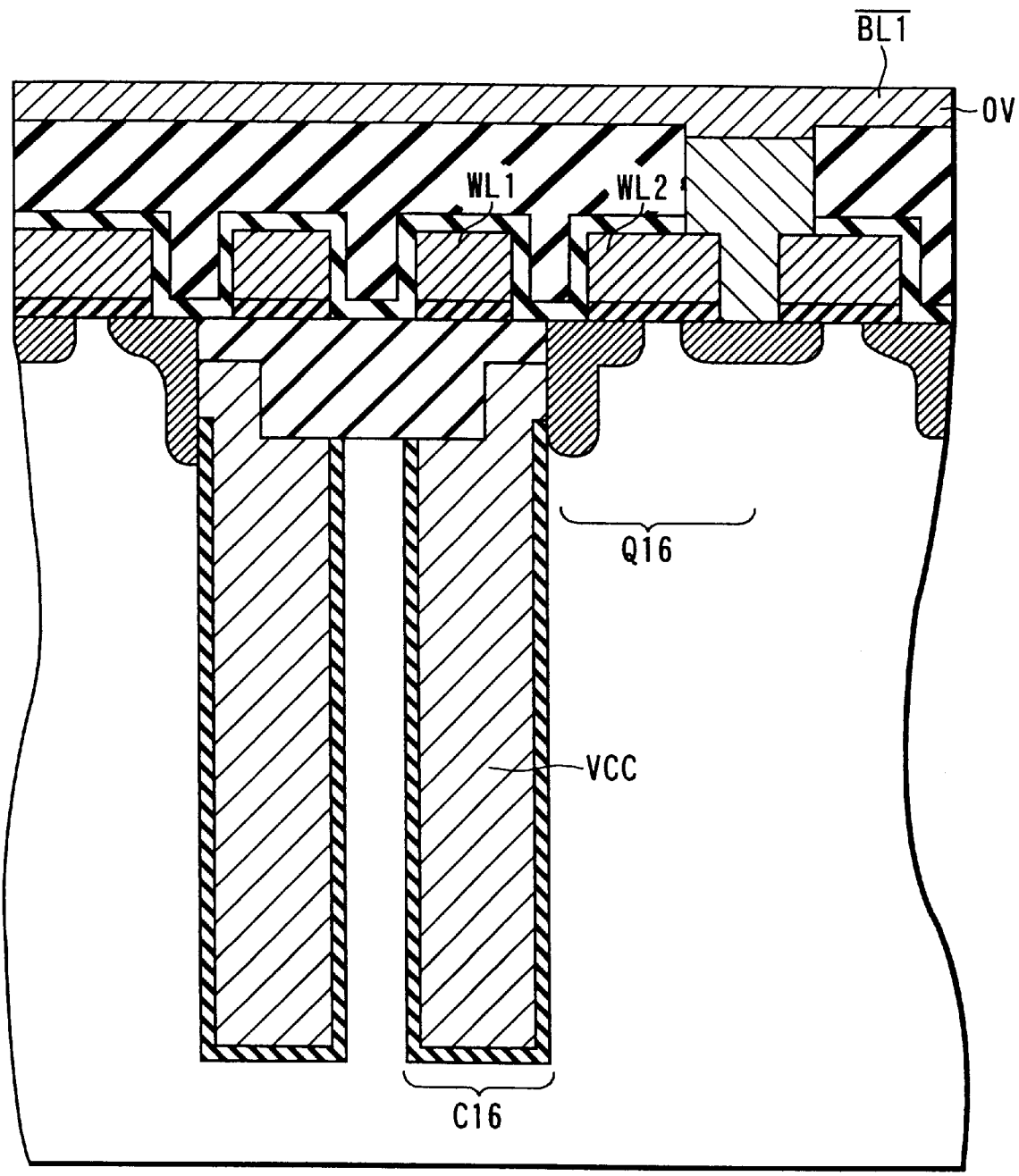
FIG. 9 is a cross-sectional view for explaining a stress applied to a memory cell by the Cell transfer-gate leak acceleration test of FIG. 8.
Figure 10:
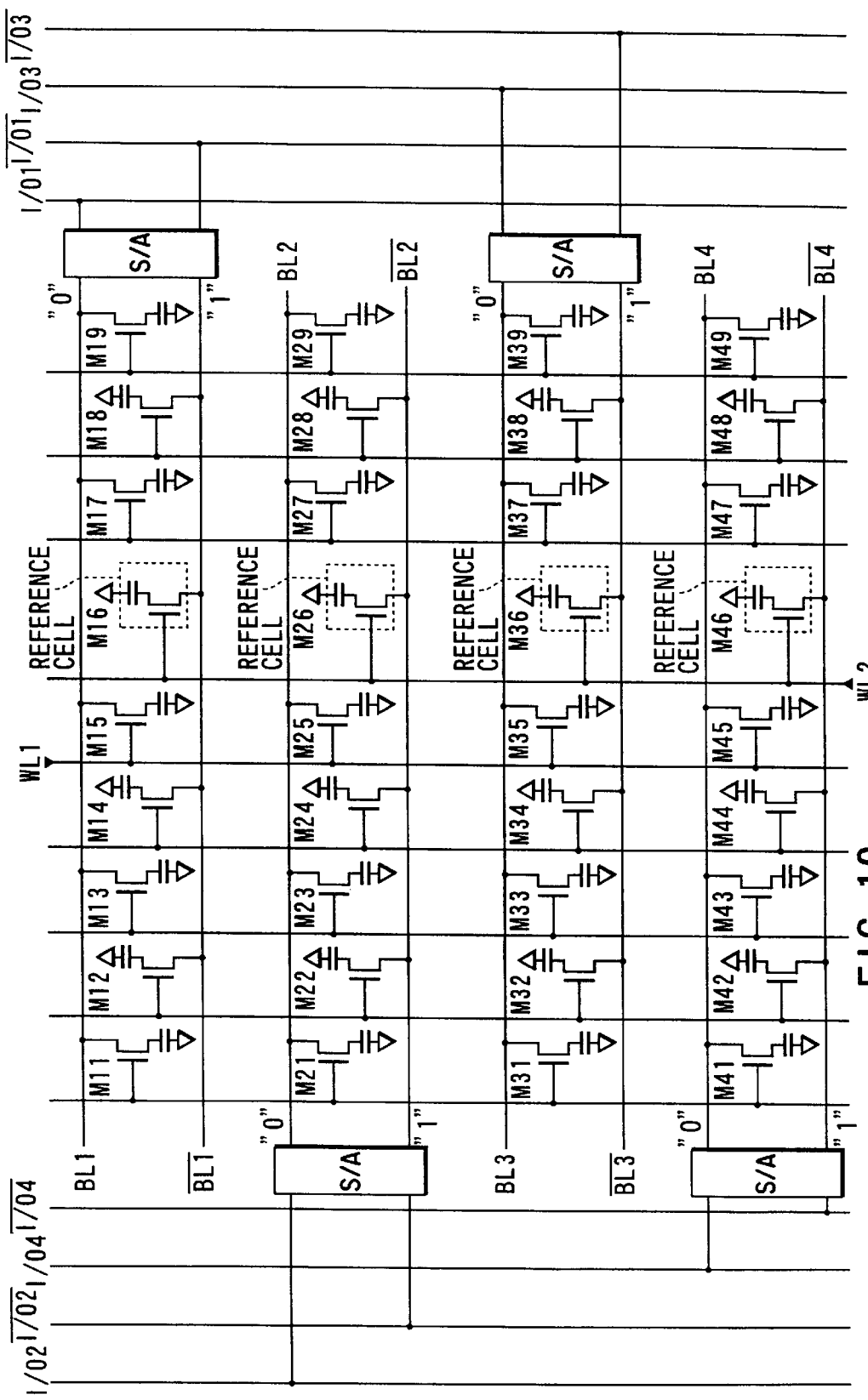
FIG. 10 is a diagram for explaining a conventional Cell transfer-gate leak acceleration test.

The memory cell array 11 is structured by a large number of DRAM memory cells disposed in a row and column matrix shape. A large number of pairs of bit lines BL1 and /BL1, . . . , BLn and /BLn are disposed in a column direction and a large number of word lines WL1 to WLm are disposed in a row direction of this memory cell array 11, respectively. Each of the DRAM memory cells is structured by a select transistor and a trench-type capacitor, with the drain of this select transistor being connected to a corresponding bit line and the gate thereof being connected to a corresponding word line, as explained in FIG. 9. In this case, a memory cell connected to the bit line BL side and a memory cell connected to the bit line /BL side are connected mutually different word lines WL. The word line driver 12, the row decoder 13 and the partial row decoder 14 are for selecting one of the word lines WL1 to WLm according to a row address input from the outside through the row address buffer 15. In this case, a two-stage decoding structure based on the partial row decoder 14 and the row decoder 13 is employed.

More specifically, the partial row decoder 14 decodes an upper bit portion of the row address, and selectively generates a plurality of word line drive signals WDLV in accordance with a result of this decoding. The row decoder 13 decodes a lower bit portion of the row address. The word line driver 12 drives one of the word lines WL1 to WLm based on the word line drive signals WDLV and a result of the decoding by the row decoder 13.

In the partial row decoder 14, there is provided a circuit for prohibiting the driving of all the word lines WL1 to WLm regardless of the value of the row address from the outside. In the test mode for testing a leakage of a charge of a memory cell through a select transistor by applying a stress to between the memory cell and the bit line, the circuit sets all the word line drive signals WDLV to a non-selective state according to test mode signal TM-BLLTC from the test mode signal generating circuit 22. With this operation, all the word lines WL1 to WLm are set to a non-selective state.

The column decoder 18 decodes a column address input from the outside through the column address buffer 19, and selects one of column selection signals CSL1 to CSLn according to a result of this decoding. Thus, a pair of bit lines of the column corresponding to the selected column selection signal are selected by the column select gate 17, so that it becomes possible to transfer data between the pair of bit lines and a data input and output line 10. The data input and output line 10 is structured by a plurality of pairs of I/O and I/O⁻ lines.

In the column decoder 18, there is provided a circuit for simultaneously selecting all the columns of the memory cell array 11 regardless of the value of a column address from the outside. In the test mode for testing a leakage of a charge of a memory cell through a select transistor by applying a stress to between the memory cell and the bit line, the circuit selects all the column selection signals CSL1 to CSLn according to test mode signal TM-BLLTC from the test mode signal generating circuit 22. With this operation, all the pairs of bit lines BL1 and /BL1, . . . , BLn and /BLn are connected to the data input and output line 10.

The row address buffer 15 receives an address ADD as a row address according to a row address strobe signal RAS⁻ from the outside, supplies an upper bit portion of the row address to the partial row decoder 14 and supplies a lower bit portion to the main row decoder 13. In the present embodiment, the upper bit portion of the row address is also used as information for assigning test mode, and therefore, the upper bit portion of the row address is also sent to the test mode signal generating circuit 22 as well as to the partial row decoder 14.

The column address buffer 19 receives an address ADD as a column address according to a column address strobe signal CAS⁻ from the outside, and supplies this column address to the column address decoder 18.

The data input circuit 20 is used in the data write cycle, and the circuit receives a write data Din from the outside via an external terminal, according to a write enable signal WE⁻ from the outside that is turned on during a data write cycle, and outputs this data Din to the data input and output line 10. The data output circuit 21 is used in the data read-out cycle, and the circuit outputs a data Dout, read out to the data input and output line 10 from the memory cell array 11, to the outside via an external terminal, according to an output enable signal OE⁻ from the output that is turned on during the data read-out cycle.

The test mode signal generating circuit 22 is for controlling the operation in various kinds of test mode including the above-mentioned charge leakage test. A normal WCBR cycle (Write CAS before RAS cycle) is used for the assignment of test mode of the test mode signal generating circuit 22. By decoding an input address from the outside in the WCBR cycle, a kind of test mode to be executed is determined. When the test mode of a charge leakage test has been assigned by the input address input from the outside, the test mode signal generating circuit 22 generates a charge leakage test mode signal TM-BBLTC.

Figure 11:
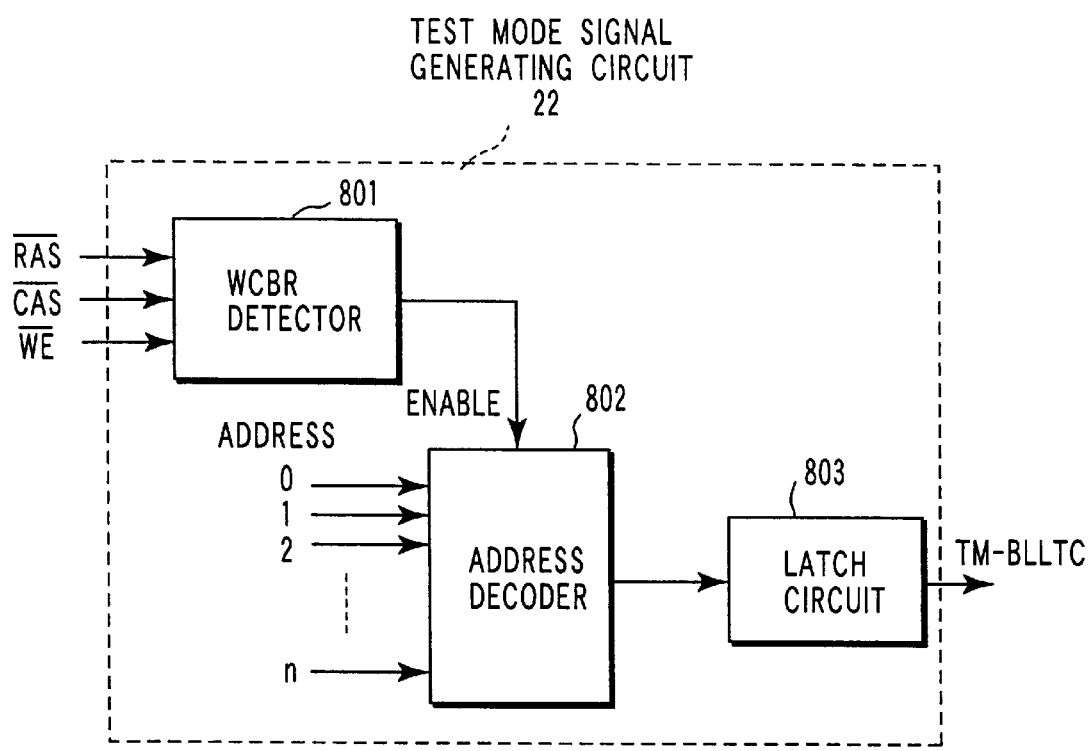
FIG. 11 is a block diagram for showing an example of a detailed structure of a test mode signal generating circuit provided in the DRAM of the first embodiment of the present invention.

An example of the test mode signal generating circuit 22 is structured by a WCBR cycle detector 801, an address decoder 802, and a latch circuit 803, as shown in FIG. 11. The WCBR cycle detector 801 receives a /RAS signal, a /CAS signal, and a /WE signal and detects a WCBR cycle. When the WCBR cycle detector 801 detects a WCBR cycle, it outputs an enabling signal for enabling the address decoder 802. The address decoder 802 receives and decodes an address input signal, and when the address decoder 802 receives the enabling signal from the WCBR cycle detector 801, then the address decoder 802 outputs the test mode signal TM-BLLTC when the test mode assigned by the input address is a charge leakage test mode. The test mode signal TM-BLLTC is latched by the latch circuit 803 and then output from the test mode signal generating circuit 22.

In the case of testing a charge leakage of the memory cells by applying a stress to between a memory cell and a bit line in the DRAM shown in FIG. 1, at first, data 1 is written into all the memory cells. Then, test mode for showing a charge leakage test is assigned in the WCBR cycle. By this arrangement, a test mode signal TM-BBLTC is generated, and all the pairs of bit lines BL1 and /BL1, . . . , BLn and /BLn are set to a select state regardless of an address from the outside and a selection of all the word lines WL1 to WLm is prohibited. In this state, a write cycle is executed and data input from the outside is transferred simultaneously to all the pairs of bit lines through the data input circuit 20 and the data input and output line 10. Thus, the voltage of each pair of bit lines BL and /BL is controlled by the data on the data input and output line 10, and the bit line BL is set to VC and the bit line /BL is set to 0 V, or alternately the bit line BL is set to 0 V and the bit line /BL is set to VCC. However, since no word line is driven in this write cycle, no data on the bit lines BL and /BL is written into the memory cells.

Accordingly, when the bit line BL is set to VCC and the bit line /BL is set to 0 V by the data on the data input and output line 10, the voltage VCC is applied to between the drain and the source of the select transistor of each memory cell connected to the bit lines /BL1, . . . , /BLn side, so that a stress can be applied to all the memory cells connected to the bit lines /BL1, . . . , /BLn side. On the other hand, when the bit line BL is set to 0 V and the bit line /BL is set to VCC by the data on the data input and output line 10, the voltage VCC is applied to between the drain and the source of the select transistor of each memory cell connected to the bit lines BL1, . . . , BLn side, so that a stress can be applied to all the memory cells connected to the bit lines BL1, . . . , BLn side.

Figure 2:
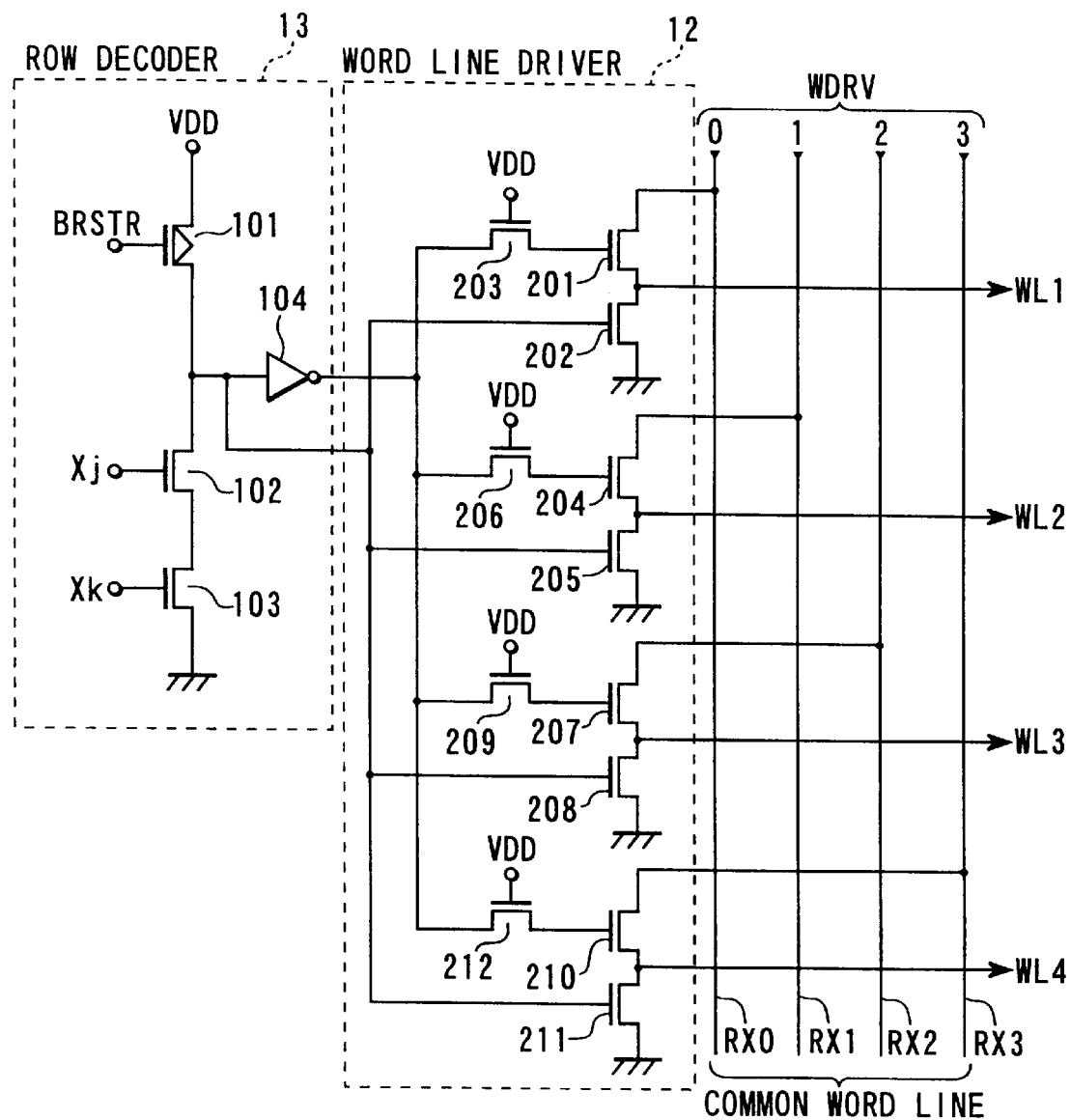
FIG. 2 is a circuit diagram for showing a detailed structure of a row decoder and a word line driver provided in the DRAM of the first embodiment of the present invention.

FIG. 2 shows a detailed structure of the word line driver 12 and the row decoder 13.

The word line driver 12 and the row decoder 13 are provided in division to correspond to each four word lines. There will be explained below a structure corresponding to the word lines WL1 to WL4.

The row decoder 13 is structured by a NAND gate of CMOS structure comprising a P-channel MOS transistor 101 and N-channel MOS transistors 102 and 103 having a current path connected in series between a power supply VDD terminal and a ground terminal, and a CMOS inverter 104 connected to an output of this NAND gate. In this case, the power supply voltage of the power supply VDD terminal is set to VCC+Vth. Vth is a threshold voltage of the N-channel MOS transistor.

A boot strap signal BRSTR that becomes a "0" level during a driving of a word line is input to the gate of the P-channel MOS transistor 101, and pre-decoded row address signals Xj and Xk are input to the gates of the N-channel MOS transistors 102 and 103.

The word line driver 12 is provided with four drive circuits for driving the word lines WL1, WL2, WL3 and WL4, respectively. These drive circuits are connected to four common word lines RX0 to RX3 respectively for being driven by word drive signals WDRV0, 1, 2 and 3 from the partial row decoder 14.

The drive circuit corresponding to the word line WL1 is structured by N-channel MOS transistors 201, 202 and 203 as shown. The current paths of the N-channel MOS transistors 201 and 202 are connected in series between the common word line RX0 and the ground terminal, and a node between the transistor 201 and the transistor 202 is connected to the word line WL1. The gate of the transistor 201 is connected to the output of the inverter 104 of the row decoder 13 through the normally-on N-channel MOS transistor 203, and the gate of the transistor 202 is connected to the output of the NAND gate of the row decoder 13.

The drive circuits corresponding to other word lines WL2, WL3 and WL4 are also structured in a similar manner to that of the drive circuit corresponding to the word line WL1.

In the above-described circuit structure, when both the row address signals Xj and Xk are "1", the row decoder 13 corresponding to the word lines WL1 to WL4 is selected, and the output of the NAND gate of the row decoder 13 becomes "0" and the output of the inverter 104 becomes "1". Thus, the N-channel MOS transistors 201, 204, 207 and 210 of the drive circuit corresponding to the word lines WL1, WL2, WL3 and WL4 respectively provided in the word line driver 12 are turned on, and the N-channel MOS transistors 202, 205, 208 and 211 are turned off. Thereafter, when one of the four common word lines RX0 to RX3 is selected, one word line corresponding to this selected common word line is driven.

Figure 3:
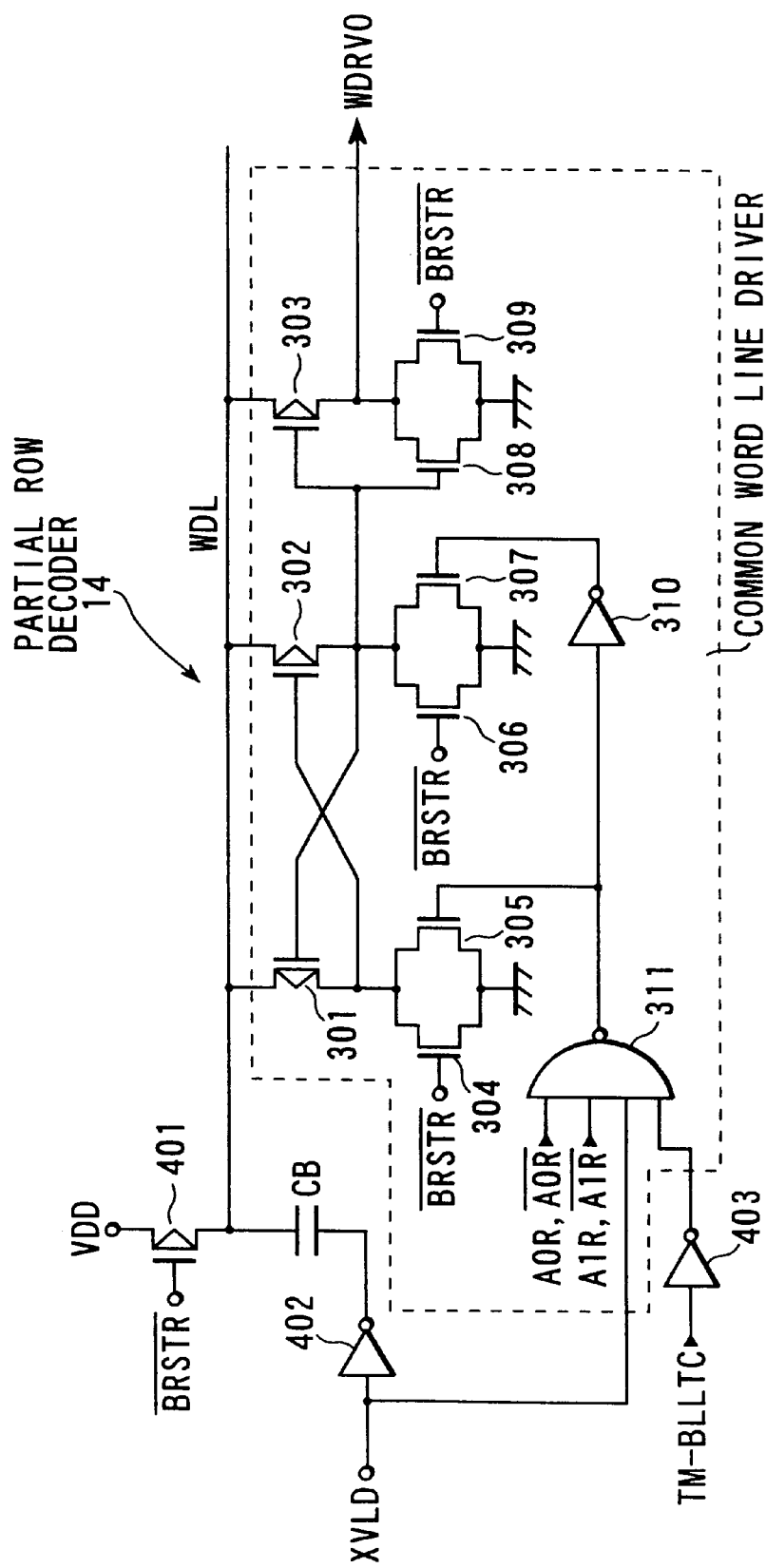
FIG. 3 is a circuit diagram for showing a detailed structure of a partial row decoder provided in the DRAM of the first embodiment of the present invention.

FIG. 3 shows a structure of the partial row decoder 14 for generating the word line drive signals WDRV0, 1, 2 and 3 for selecting the four common word lines RX0 to RX3.

The partial row decoder 14 is structured by four common word line drive circuits corresponding to the word line drive signals WDRV0, 1, 2 and 3 respectively and a common control circuit section common to these four common word line drive circuits.

The common word drive circuit corresponding to the word line drive signal WDRV0 is structured by P-channel MOS transistors 301, 302 and 303, N-channel MOS transistors 303 to 309, a four-input NAND gate 311 and a CMOS inverter 310, as shown in the drawing. The four-input NAND gate 311 is applied with an input of pre-decoded row address signals A0R and A1R$^{31}$ and is also applied with an input of a boosted pulse signal XVLD and test mode signal TM-BLLTC inverted by a CMOS inverter 403.

The control circuit section is structured by an N-channel MOS transistor 401 for pre-charging a common node WDL to the four common word line drive circuits, a boosting capacitor CB and a buffer circuit 402 for driving the boosting capacitor CB by a boosted pulse signal XVLD.

In the circuit of FIG. 3, at first, the node WDL is pre-charged to VDD-Vth, and thereafter, a boosted pulse signal XVLD of "1" is generated immediately after the row address has been established, so that the voltage of the node WDL is increased to a word line driving voltage by the boosting capacitor CB.

In the normal operation mode, the test mode signal TM-BLLTC is "0" and a word line drive signal WDRV0 is generated when both of the row address signals A0R and A1R$^-$ are "1", and the common word line RX0 shown in FIG. 2 is set to a high level same as that of the node WDL. Thus, it becomes possible to drive the word line WL1 corresponding to the common word line RX0.

On the other hand, in the test mode, the test mode signal TM-BLLTC is "1" and the word line drive signal WDRV0 is not generated regardless of the values of the row address signals A0R and A1R$^-$. The common word line drive circuits corresponding to the common word line drive signals WDRV1 to 3 have structures similar to that of the circuit of the common word line drive signal WDRV0, except the combination of address signals input to the NAND gate is different. Therefore, the driving of all the word lines is prohibited in the test mode where the test mode signal TM-BLLTC is "1".

Figure 4:
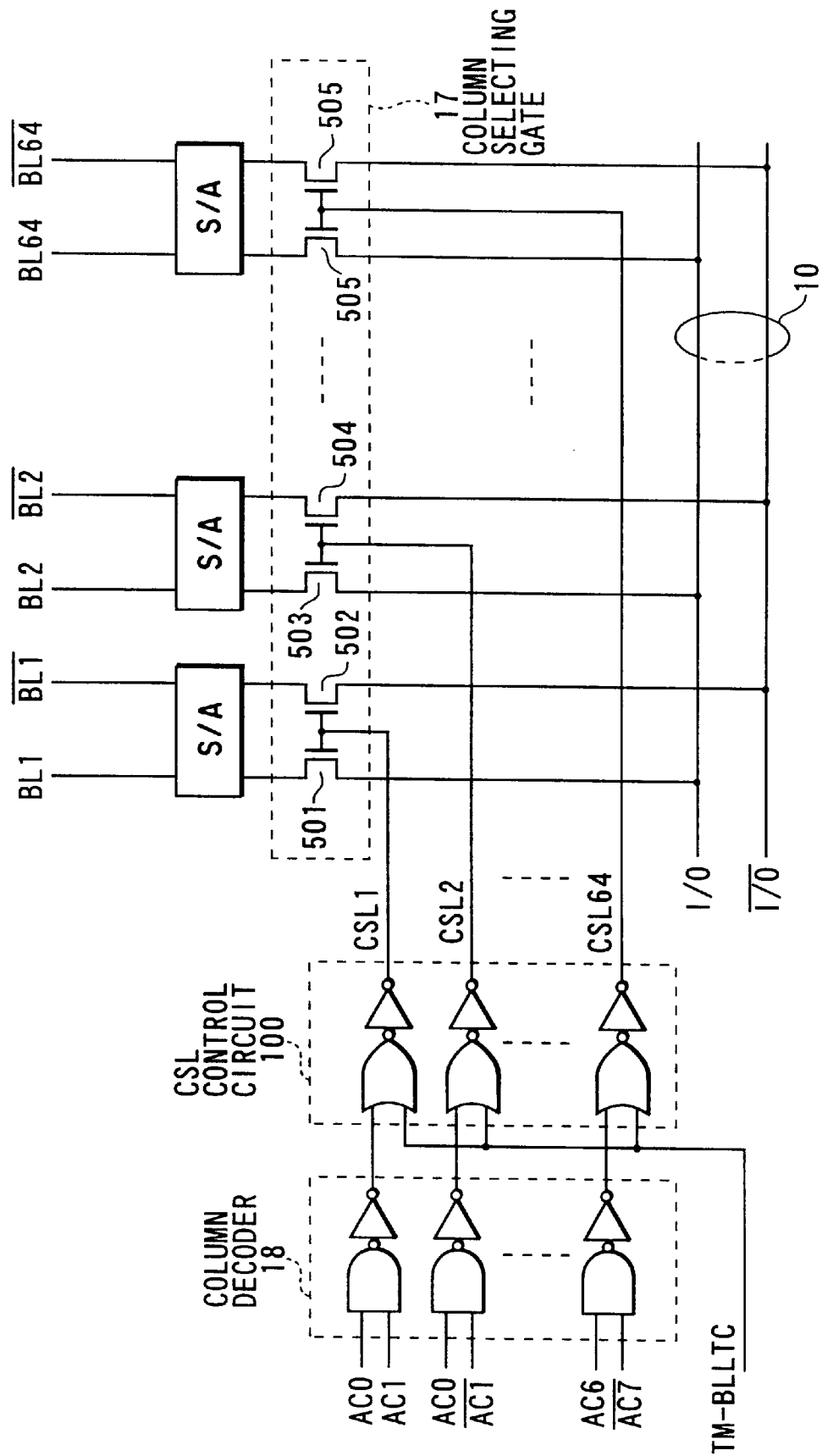
FIG. 4 is a circuit diagram for showing a detailed structure of a column decoder and its periphery provided in the DRAM of the first embodiment of the present invention.

FIG. 4 shows a circuit structure of the column decoder and its periphery corresponding to a case where the memory cell array 11 has 64 columns.

The column decoder 18 has decoding units, each including a NAND gate and an inverter, by the number corresponding to the number of columns of the memory cells, as shown. A pre-decoded two-bit column address signals of different combination is applied to the NAND gate of each decoding unit. The column decoder 18 has a CSL control circuit 100 provided at its output stage.

The CSL control circuit 100 is structured by OR gates of the number corresponding to the number of columns, for test mode signal TM-BLLTC being applied to one input and an output from a decoding unit corresponding to the column decoder 18 being applied to the other input, and an inverter provided in the output stage of each OR gate. Accordingly, when the test mode signal TM-BLLTC is "1", all the column select signals CSL1 to CSL64 become "1" regardless of the value of a column address, and an ON state is set to all of column selecting N-channel MOS transistors 501 and 502 corresponding to the pair of bit lines BL1 and /BL1, column selecting N-channel MOS transistors 503 and 504 corresponding to the pair of bit lines BL2 and /BL2, . . . , and column selecting N-channel MOS transistors 505 and 506 corresponding to the pair of bit lines BL64 and BL64$^-$ and connected to I/O I/O$^-$ line of the data input and output 10.

Figure 5:
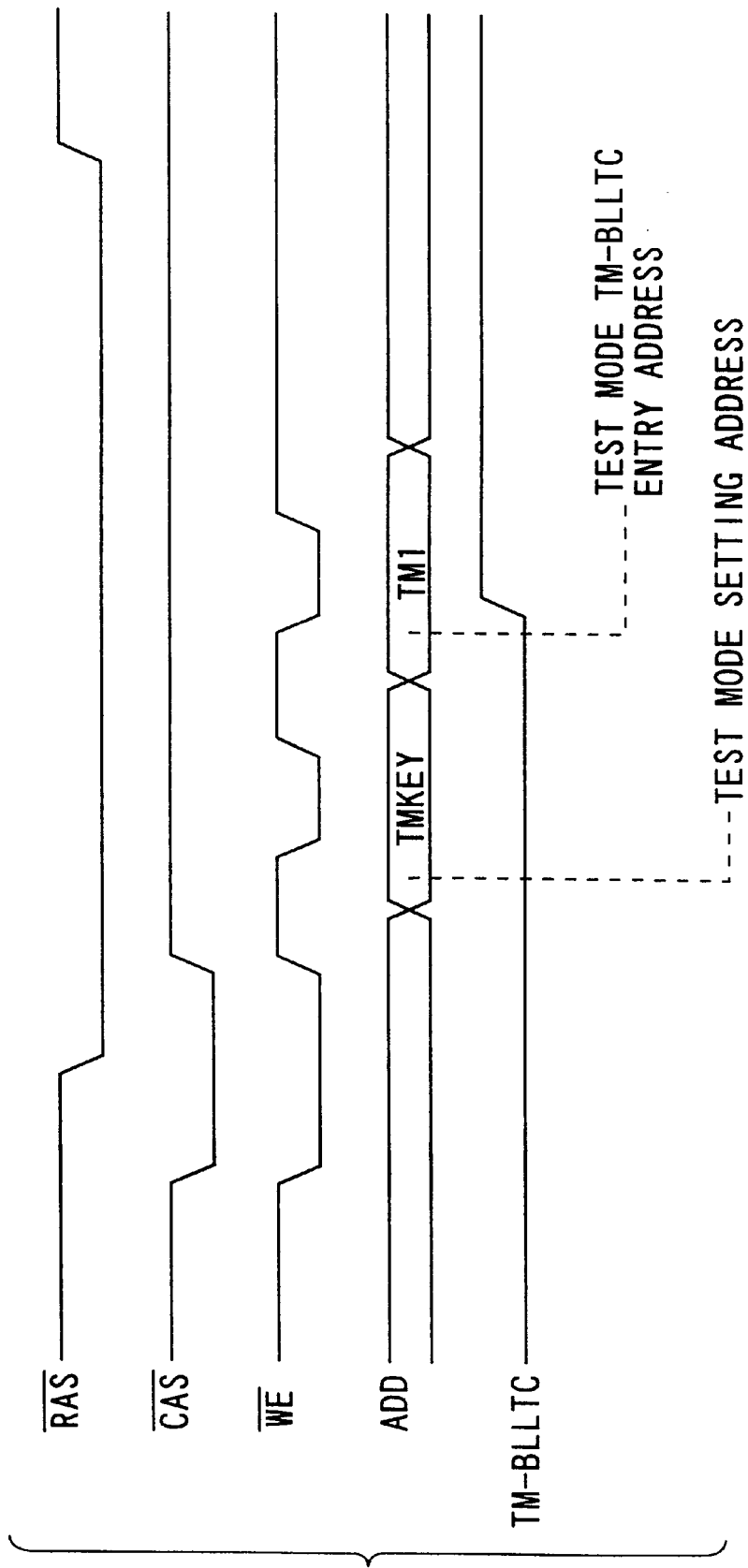
FIG. 5 is a timing chart for explaining test mode entry operation of the DRAM of the first embodiment of the present invention.

FIG. 5 is a timing chart of test mode entry operation for setting test mode to be executed to the test mode signal generating circuit 22.

For changing the operation mode of the DRAM shown in FIG. 1 from a normal operation mode to test mode, the column address strobe signal CAS$^-$ and the write enable signal WE$^-$ are rendered to low level before the row address strobe signal RAS$^-$ is rendered to low level. By this operation, the fact that the current cycle is the WCBR cycle is posted to the test mode signal generating circuit 22. Thereafter, each time when the write enable signal WE$^-$ is changed from a high level to low level, an input address (a low address) from the outside is taken into the test mode signal generating circuit 22 and this is decoded.

In the drawing, TMKey is an address called "010101", for example, and this address is for instructing the DRAM to be set to test mode to be assigned by an address that follows. Accordingly, the value of the first input address of the WCBR cycle becomes TMKey without an exception. TM1 that is input after that is an address called "000111", for example, and this address assigns test mode for testing a charge leakage through a select transistor of a memory cell by applying a stress to between the memory cell and a bit line. In this case, the above-described test mode signal TM-BLLTC is set to "1" as shown in the drawing.

If an address for assigning a different test mode is input instead of TM1, the test mode assigned by this address is selected.

For returning the DRAM from test mode to the normal operation mode, the following methods are available:
(1) To execute the RAS Only Refresh cycle,
(2) To execute the CAS before RAS cycle, and
(3) To input an address for meaning "to go out of the test mode" in the above-described WCBR cycle.

The use of any one of the above methods makes it possible to return the DRAM from test mode to a normal operation mode.

Figure 6:
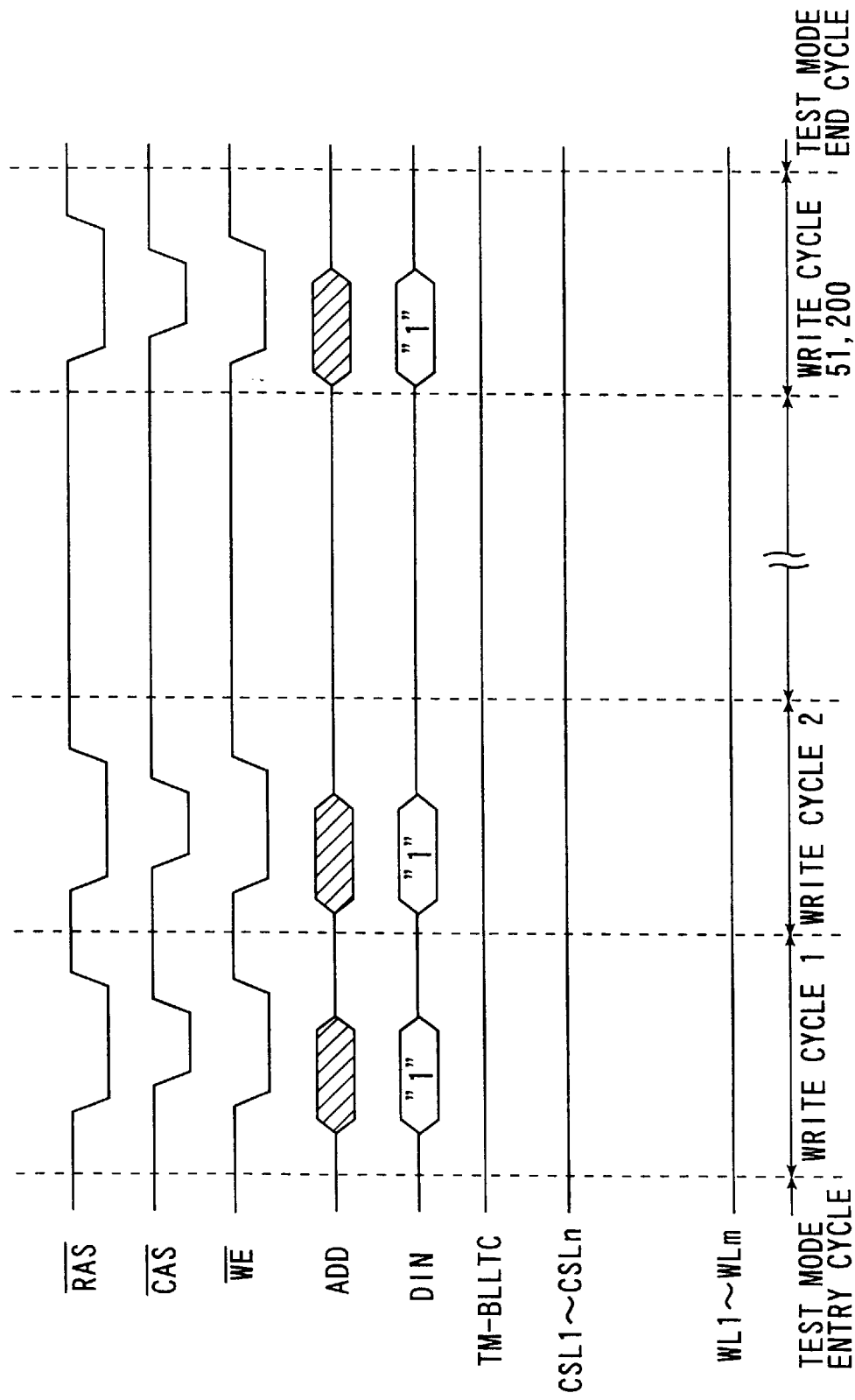
FIG. 6 is a timing chart for explaining a test operation of the DRAM of the first embodiment of the present invention.

FIG. 6 is a timing chart for showing a series of operation to be executed in the test mode for testing a charge leakage through a select transistor of a memory cell.

At first, data "1" is written into all the memory cells. Then, the test mode entry cycle explained with reference to FIG. 4 is executed and the test mode is assigned for testing a charge leakage of a memory cell by applying a stress to between the memory cell and a bit line. With this arrangement, the test mode signal TM-BLLTC changes from a "0" level to a "1" level, and all the word lines are set to a non-selective state, with all the columns set to a selective state.

Thereafter, the write cycle is executed, and input data "1" is transferred from the outside to all the pairs of bit lines through the data input and output line, so that the voltage of BL1, BL2, . . . , BLn is set to VCC and the voltage of /BL1, /BL2, . . . , /BLn is set to 0 V. As a result, the voltage VCC is applied to between the drain and the source of the select transistor of each memory cell connected to the bit lines /BL1, /BL2, . . . , /BLn side, and a stress is applied to all the memory cells connected to the bit lines /BL1, . . . , /BLn side. As one write cycle is about 10 µs, it is possible to apply a stress for a period of 512 ms in a manner similar to that of the conventional "Cell transfer-gate leak acceleration test" by repeating the write cycle using the input data "1" by 51,200 times.

Thereafter, when the test mode exit cycle for exiting the test mode is executed, the operation mode of the DRAM returns to the normal operation mode from the test mode, and the test mode signal TM-BLLTC becomes the "0" level.

In actual practice, the test mode exit cycle is not executed immediately after completing the write cycle using the input data "1" by 51,200 times, but the write cycle using the input data "0" is repeated by 51,200 times for testing a leakage of each memory cell connected to the bit lines BL1, BL2, ..., BLn side.

After exiting the test mode, a data reading operation for checking a presence or absence of a leakage is carried out. In other words, data of all the memory cells are read out by the normal data reading operation, and it is checked whether the value of the data read out from each memory cell coincides with the expected value "1" or not. There is no leakage of a charge in a memory cell if the value of the read-out data coincides with the expected value "1", and there is a charge leakage in a memory cell if the value of the read-out data coincides with "0".

As explained above, according to the first embodiment of the present invention, since a semiconductor memory device has a structure for directly controlling the bit line voltage based on the data written from the data input and output line 10 instead of utilizing data read out from the memory cells, it is possible to carry out accurately a testing of charge leakage without a failure of a memory cell.

Although description has been made of the case where the write data is input from the outside of the semiconductor chip, the testing write data to be given to the bit lines is not necessarily required to be input from the outside of the semiconductor chip, but it is also possible to generate the testing write data internally by, for example, connecting the data input and output line 10 to the power supply terminal or the ground terminal. In this case, it is not necessary to control the write cycle from the outside, but the write cycle can be automatically generated within the semiconductor chip by, for example, triggering a generation of the test mode signal TM-BLLTC from the test mode signal generating circuit 22.

(Second embodiment)

A second embodiment of the DRAM according to the present invention will be explained next.

According to a second embodiment, the bit line voltage is not controlled by data from the data input and output line 10, but a switching circuit is provided between a predetermined power voltage supply terminal such as a power supply or a ground and each bit line, and the switching circuit is turned on in the test mode, thereby to control the bit line voltage.

Figure 7:
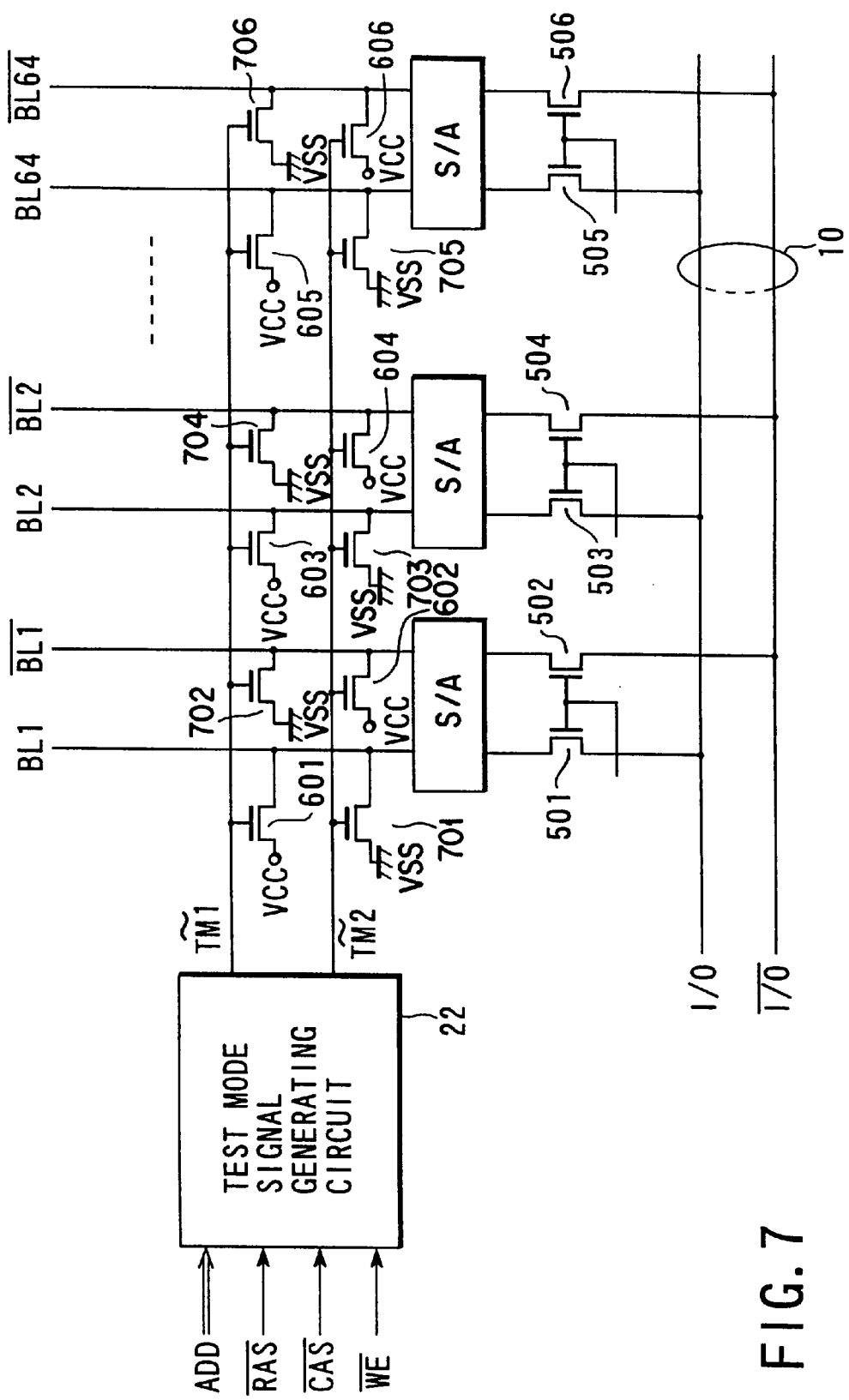
FIG. 7 is a diagram for explaining a switching circuit for setting a bit line voltage to be used in the DRAM relating to a second embodiment of the present invention.
Figure 8:
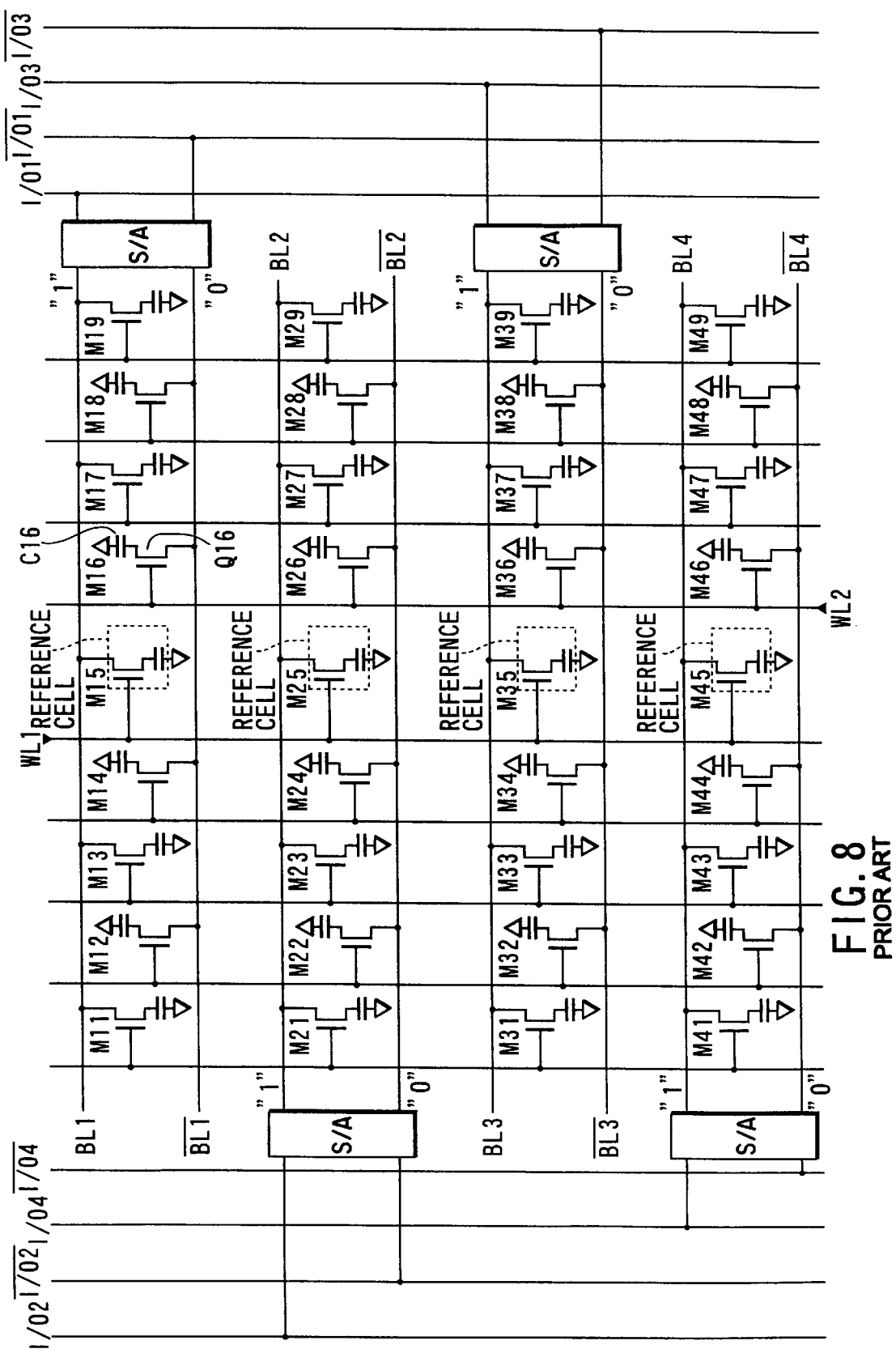
FIG. 8 is a diagram for explaining a conventional Cell transfer-gate leak acceleration test.

FIG. 7 shows one example of detailed circuit structure for controlling the voltage of the bit line. One end of N-channel MOS transistor 601 and one end of N-channel MOS transistor 701 are connected to a bit line BL1 of a pair of bit lines BL1 and /BL1 of a first column, with the other end respectively being connected to a power supply VCC terminal and the ground Vss. One end of N-channel MOS transistor 602 and one end of N-channel MOS transistor 702 are connected to a bit line /BL1 of the pair of bit lines BL1 and /BL1 of the first column, with the other end respectively being connected to the power supply VCC terminal and the ground Vss. A first test signal TM1 is a switch control signal and is supplied to the gates of the N-channel MOS transistors 601 and 702 from test mode signal generating circuit 22, and a second test signal TM2 is a switch control signal and is supplied to the gates of the N-channel MOS transistor 602 and 701 from the test mode signal generating circuit 22.

There are also N-channel MOS transistors 603 to 606 for switching connected to pairs of bit lines in a second column afterwards, between each bit line and a power supply VCC terminal, as shown in the drawing. Similarly, there are also N-channel MOS transistors 703 to 706 for switching connected to pairs of bit lines in a second column afterwards, between each bit line and the ground Vcc, as shown in the drawing. The first test signal TM1 is supplied to the gates of the N-channel MOS transistors 603, 605, 704 and 706, and the second test signal TM2 is supplied to the gates of the N-channel MOS transistors 604, 606, 703 and 705.

The test mode signal generating circuit 22 generates the first and second test signals TM1 and TM2 for a predetermined period respectively when the test charge leakage test mode has bee assigned. The test operation is executed in a state that each sense amplifier (S/A) is activated. With this arrangement, during a period while the test signal TM1 is being generated, the voltage of the bit lines BL1, BL2, BLn is set to VCC respectively and the voltage of the bit lines /BL1, /BL2, ..., /BLn is set to 0 V respectively, and a charge leakage of the memory cells connected to the bit lines /BL1, /BL2, ..., /BLn can be tested. During a period while the test signal TM2 is being generated, the voltage of the bit lines BL1, BL2, ..., BLn is set to 0 V respectively and the voltage of the bit lines /BL1, /BL2, ..., /BLn is set to VCC respectively, and a charge leakage of the memory cells connected to the bit lines BL1, BL2, ..., BLn can be tested.

As explained above, it is also possible to test a leakage of the charge of each memory cell by providing a switching circuit between each bit line and a predetermined power supply terminal.

The test operation can also be carried out by repeatedly executing the RAS Only Refresh cycle in the state that one of the first and second test signals TM1 and TM2 is kept generated. In this case, it is preferable that the drive of all the word lines is prohibited by the test mode signal TM-BLLTC, as explained in the first embodiment. Further, since it is not necessary to select all the columns, a column decoder with a normal structure can be utilized. Further, it is also possible to modify the structure so long as the voltage of the bit line is controlled by a switch transistor. For example, it is also possible to provide a switch transistor between the ground terminal and the bit line. Alternately, it is also possible to have such a structure that all of the bit lines BL1, BL2, ..., BLn and the bit lines /BL1, /BL2, ..., /BLn are set to 0 V simultaneously by the switch transistor.

As explained above, according to the present invention, it becomes possible to execute a screening of all the memory cells accurately and in a simple manner regardless of a failure of a memory cell or a replacement of a block or word line to a spare element, by writing data on the data input and output line onto a bit line or by connecting a bit line to a power supply line or a ground by a switching circuit, instead of utilizing data read from the memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device, comprising:
    a memory cell array structured by a plurality of memory cells disposed in a row and column matrix shape, each memory cell being connected to a bit line and a word line;
    a row decoder for selecting one word line from said plurality of word lines based on an address signal from outside;
    a non-selective state setting circuit for setting all of said plurality of word lines to a non-selective state according to test mode signal;
    a column decoder for selecting a column from which data is to be read and into which data is to be written, from a plurality of columns within said memory cell array based on the address signal from outside;

a data input and output line used for data input and output between said memory cell array and an external terminal and for being connected to a bit line of a selected column;

a selective-state setting circuit for setting all of said plurality of columns within said memory cell array to a selective-state according to said test mode signal; and test mode signal generating circuit for generating said test mode signal in test mode for testing a leakage of a charge held in a memory cell.

2. A semiconductor memory device according to claim 1, wherein said test mode signal generating circuit decodes the address signal input from outside in a CAS before RAS cycle and generates said test mode signal when the input address signal assigns said test mode.

3. A semiconductor memory device according to claim 1, wherein said row decoder comprises:

a first row decoder circuit for decoding a high-order bit of a row address of the address signal input from outside and for generating a signal for selectively driving a plurality of word line drive signal lines according to a result of said decoding; and a second row decoding circuit for decoding a low-order bit of the row address of the address signal input from outside and for selecting one of said plurality of word lines based on a result of said decoding and a driving state of said plurality of word line drive signal lines, wherein said non-selective state setting circuit for setting said plurality of word lines to all non-selective state includes a circuit for prohibiting the driving of said word line drive signal lines by said first row decoder circuit according to said test mode signal.

4. A semiconductor memory device according to claim 1, wherein said test mode signal generating circuit includes a WCBR cycle detector and an address decoder, the WCBR cycle detector receives a /RAS signal, a /CAS signal, and a /WE signal, and generates an enabling signal for enabling the address decoder, when the WCBR cycle detector detects a WCBR cycle, the address decoder receives and decodes an address input signal, and outputs a decoded signal as the test mode signal in accordance with the enabling signal from the WCBR cycle detector when a test mode assigned by the address input signal is a charge leakage test mode.

5. A semiconductor memory device according to claim 1, wherein said test mode signal generating circuit further includes a latch circuit for latching the test mode signal output from the address decoder.

6. A semiconductor memory device, comprising:

a memory cell array structured by a plurality of memory cells disposed in a row and column matrix shape, each memory cell being connected to a bit line and a word line;

a row decoder for selecting one word line from said plurality of word lines based on an address signal input from outside;

a column decoder for selecting a column from which data is to be read and into which data is to be written, from a plurality of columns within said memory cell array, based on the address signal input from outside;

a data input and output line used for data input and output between said memory cell array and an external terminal and for being connected to a bit line of a selected column;

a switching circuit provided between a bit line of each of said plurality of columns and a power supply terminal for supplying a power source voltage; and a test mode generating circuit for setting the power source voltage on each bit line by turning on said switching circuit in test mode for testing a leakage of a charge held in a memory cell.

7. A method of testing a semiconductor memory device comprising a memory cell array structured by a plurality of memory cells disposed in a row and column matrix shape, each memory cell being connected to a bit line and a word line, a row decoder for selecting one word line from said plurality of word lines based on an address signal from outside, a column decoder for selecting a column from which data is to be read and into which data is to be written, from a plurality of columns within said memory cell array based on the address signal from outside, and a data input and output line used for data input and output between said memory cell array and an external terminal and for being connected to a bit line of a selected column, wherein, in test mode for testing a leakage of a charge held in a memory cell of said semiconductor memory device, a data writing cycle is executed in a state that all of said plurality of word lines are set to a non-selective state and all of said plurality of columns are set to a selective state, and the voltages of bit lines of all of said columns are controlled based on data from said data input and output line.

8. A semiconductor memory device according to claim 6, wherein said test mode generating circuit turns on said switching circuit in the test mode.

9. A semiconductor memory device according to claim 6, wherein said pair of lines being connected to the power source voltage in the test mode, the other of said pair of lines being connected to ground potential in the test mode.

10. A semiconductor memory device according to claim 6, further comprising:

a non-selective state setting circuit for setting, in the test mode, all of said plurality of word lines to a non-selective state; and a selective-state setting circuit for setting, in the test mode, all of said plurality of columns within said memory cell array to a selective state.

* * * * *